(12) United States Patent
Khakzadi et al.

(10) Patent No.: US 7,269,803 B2
(45) Date of Patent: Sep. 11, 2007

(54) SYSTEM AND METHOD FOR MAPPING LOGICAL COMPONENTS TO PHYSICAL LOCATIONS IN AN INTEGRATED CIRCUIT DESIGN ENVIRONMENT

(75) Inventors: Khosro Khakzadi, Woodbury, MN (US); Chris J. Tremel, St. Louis Park, MN (US); Michael N. Dillon, Richfield, MN (US)

(73) Assignee: LSI Corporation, Milpitas, CA (US)

( * ) Notice: Subject to any disclaimer, the term of this patent is extended or adjusted under 35 U.S.C. 154(b) by 273 days.

(21) Appl. No.: 10/740,284

(22) Filed: Dec. 18, 2003

(65) Prior Publication Data

US 2005/0138595 A1 Jun. 23, 2005

(51) Int. Cl.
G06F 17/50 (2006.01)
H01L 23/544 (2006.01)

(52) U.S. Cl. ............ 716/3; 716/1; 716/2; 716/18; 716/19; 257/620

(58) Field of Classification Search ............ 716/1–12, 716/16–18; 326/47; 257/620
See application file for complete search history.

(56) References Cited

U.S. PATENT DOCUMENTS

| | | | |
|---|---|---|---|
| 5,124,776 A * | 6/1992 | Tanizawa et al. ............ 257/204 |
| 5,283,753 A * | 2/1994 | Schucker et al. ............ 716/17 |
| 5,737,236 A * | 4/1998 | Maziasz et al. ............ 716/8 |
| 5,910,899 A * | 6/1999 | Barrientos ............ 716/8 |
| 6,054,872 A * | 4/2000 | Fudanuki et al. ............ 326/39 |
| 6,127,874 A * | 10/2000 | Wakabayashi et al. ...... 327/292 |
| 6,189,131 B1 * | 2/2001 | Graef et al. ............ 716/8 |
| 6,334,207 B1 | 12/2001 | Joly et al. ............ 716/17 |
| 6,467,074 B1 | 10/2002 | Katsioulas et al. ............ 716/17 |
| 6,470,482 B1 * | 10/2002 | Rostoker et al. ............ 716/6 |
| 6,480,989 B2 * | 11/2002 | Chan et al. ............ 716/8 |
| 6,516,457 B1 * | 2/2003 | Kondou ............ 716/8 |
| 6,536,028 B1 | 3/2003 | Katsioulas et al. ............ 716/17 |
| 6,578,174 B2 | 6/2003 | Zizzo ............ 716/1 |
| 6,601,228 B1 * | 7/2003 | LaBerge ............ 716/16 |
| 6,611,045 B2 * | 8/2003 | Travis et al. ............ 257/620 |
| 6,760,896 B2 | 7/2004 | Andreev et al. ............ 716/10 |
| 6,779,158 B2 | 8/2004 | Whitaker et al. ............ 716/3 |
| 6,792,589 B2 | 9/2004 | Whitaker et al. ............ 716/18 |
| 6,823,499 B1 * | 11/2004 | Vasishta et al. ............ 716/7 |
| 7,003,738 B2 * | 2/2006 | Bhattacharya et al. ......... 716/1 |
| 7,043,713 B2 * | 5/2006 | Osann et al. ............ 716/19 |

(Continued)

OTHER PUBLICATIONS

McMacken, J. and Chamberlain, S.; "CHORD: A Modular Semiconductor Device Simulation Development Tool Incorporating External Network Models," IEEE Transactions on Computer-Aided Design, vol. 8, No. 8, Aug. 1989, pp. 826-836.

(Continued)

*Primary Examiner*—Jack Chiang
*Assistant Examiner*—Helen Rossoshek
(74) *Attorney, Agent, or Firm*—Westman, Champlin & Kelly

(57) ABSTRACT

A system and method for mapping Intellectual Property (IP) components onto a pre-fabricated chip slice allows a user to select a target location for placement of an IP component onto a slice. A slice definition of the pre-fabricated chip slice is searched for a legal location for the IP component that is near to the target location. The IP component is mapped to the legal location.

20 Claims, 14 Drawing Sheets

U.S. PATENT DOCUMENTS

| | | | |
|---|---|---|---|
| 2003/0233628 A1* | 12/2003 | Rana et al. | 716/18 |
| 2005/0034086 A1* | 2/2005 | Hamlin et al. | 716/3 |
| 2005/0034087 A1* | 2/2005 | Hamlin et al. | 716/3 |
| 2005/0114818 A1* | 5/2005 | Khakzadi et al. | 716/11 |
| 2005/0116738 A1* | 6/2005 | Auracher et al. | 326/47 |

OTHER PUBLICATIONS

H. Zacatelco et al.; "AnGeLa: A Smart Tool for the Automatic Layout Generation of Analog Cells," IEEE Transactions 1996, pp. 282-285.

H. Zheng et al.; "Modular Verification of Timed Circuits Using Automatic Abstraction," IEEE Transactions on Computer-Aided Design of Integrated Circuits and Systems, vol. 22, No. 9, Sep. 2003, pp. 1138-1153.

P. Agrawal.; "Emerging Technologies for Electronic Design and Test," IEEE Transactions 1994, p. 18.

M. L. Anido et al.; "TEDMOS-A CAD System for ASIC Design on IBM®-PC like Computers," IEEE Transactions 1994, pp. 420-427.

* cited by examiner

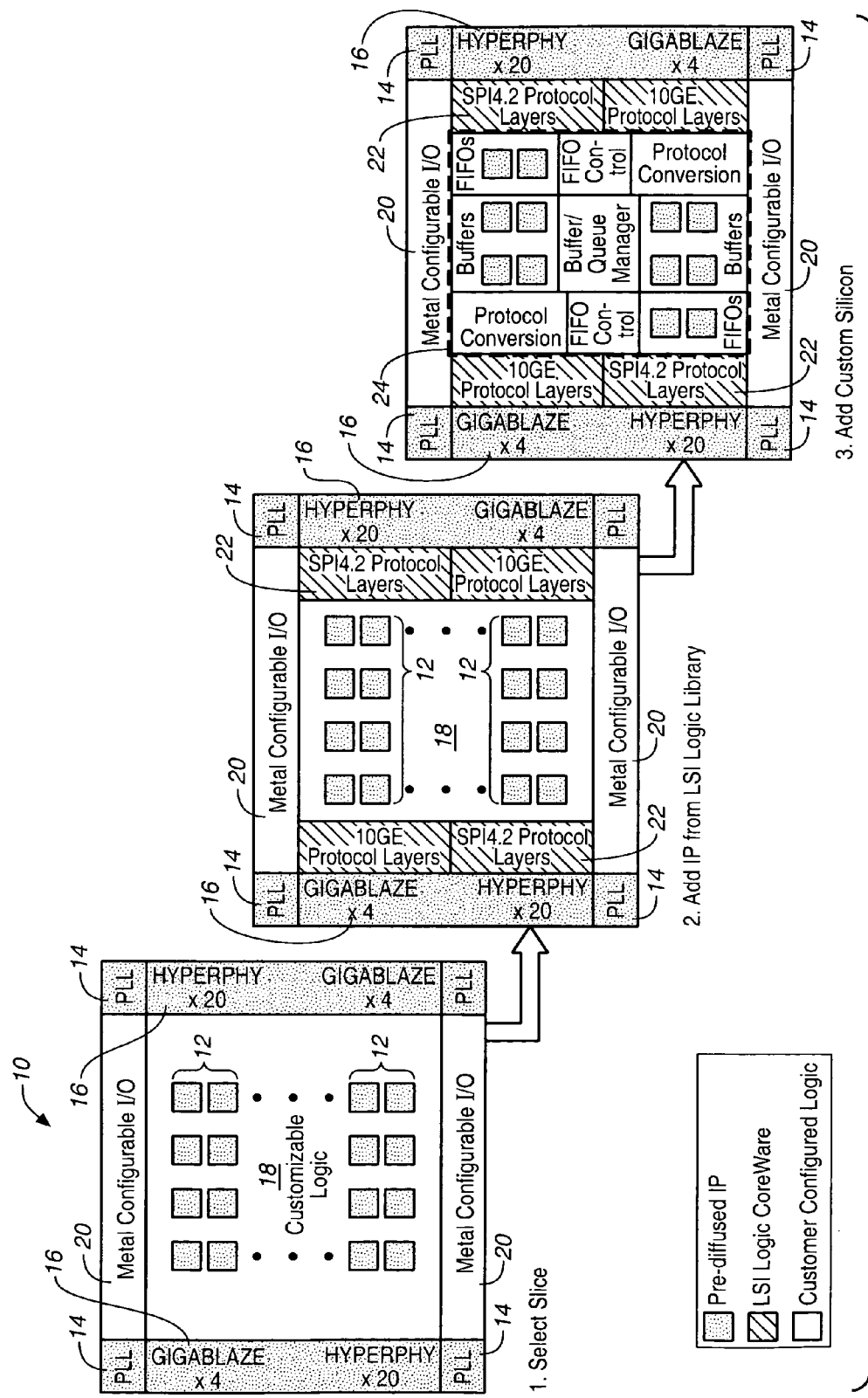
FIG._1

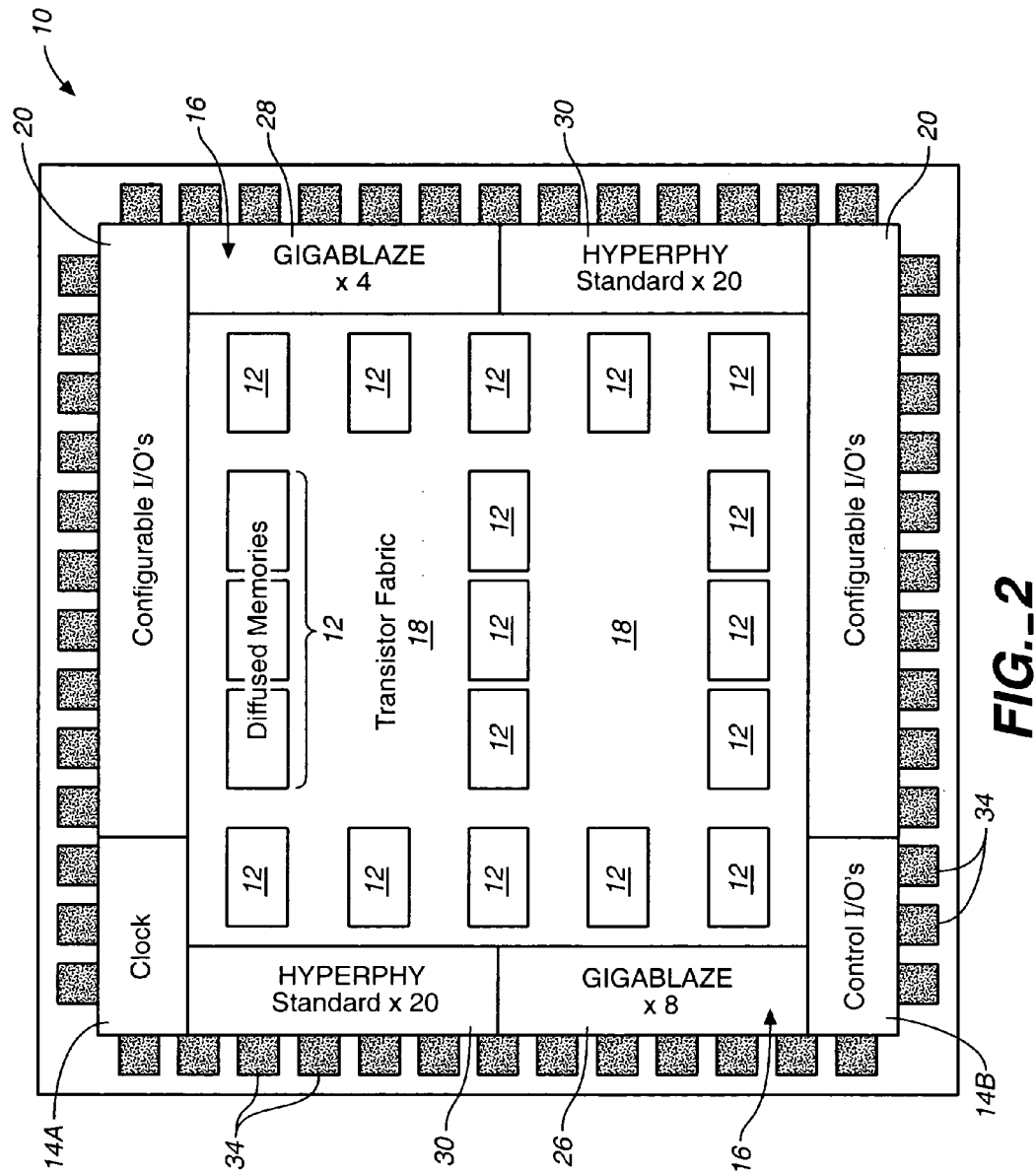
FIG._2

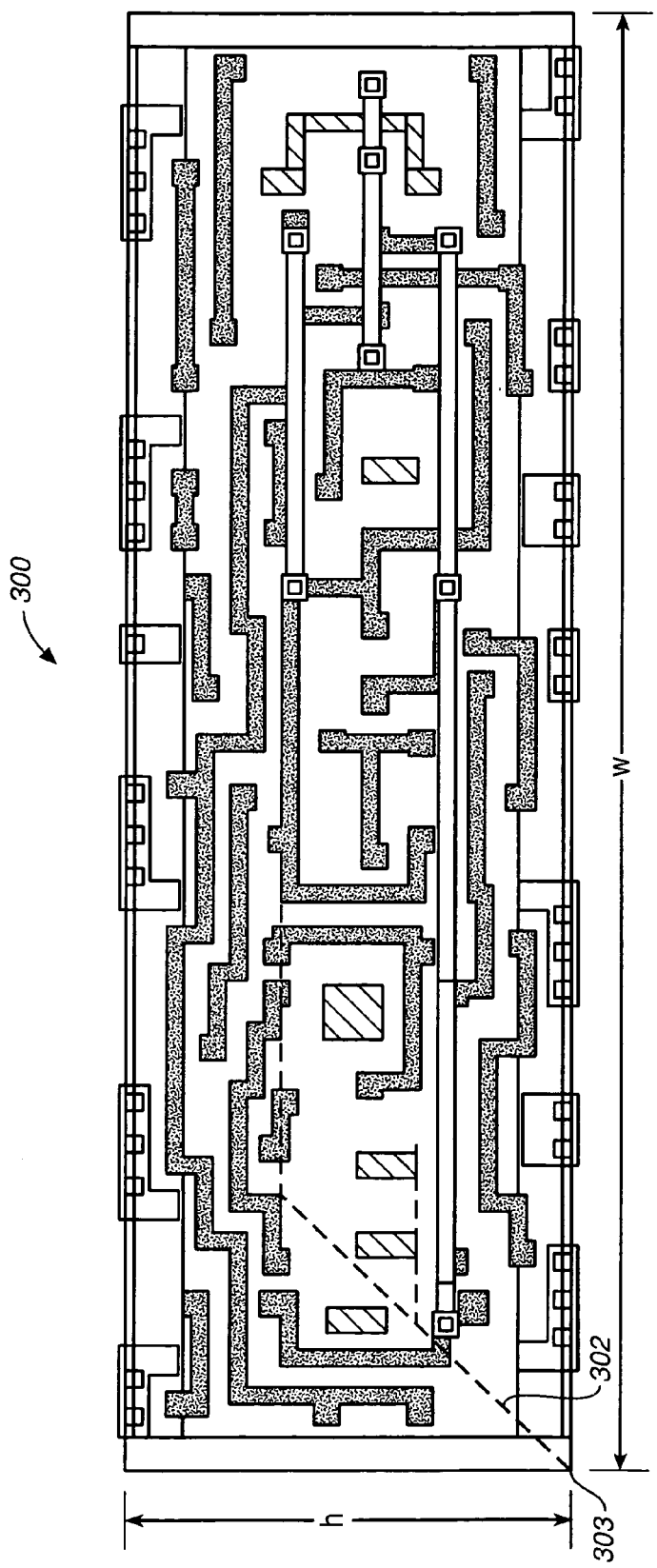
FIG._3A

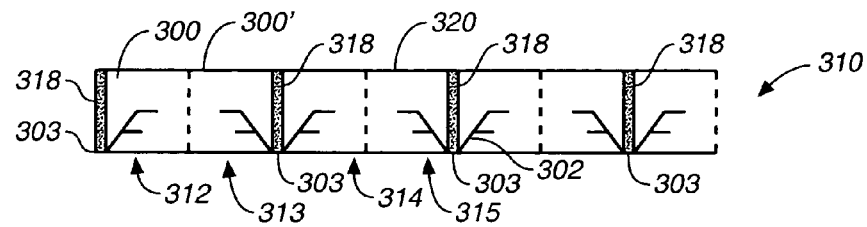
FIG._3B
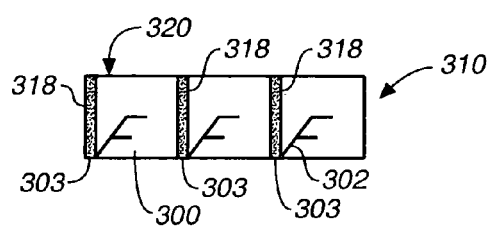
FIG._3C
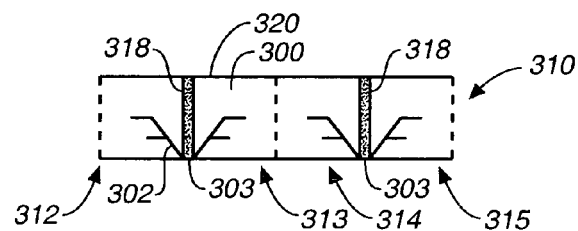
FIG._3D
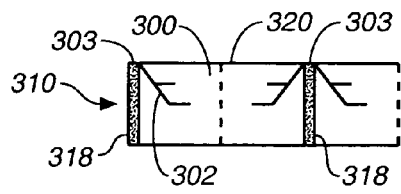
FIG._3E
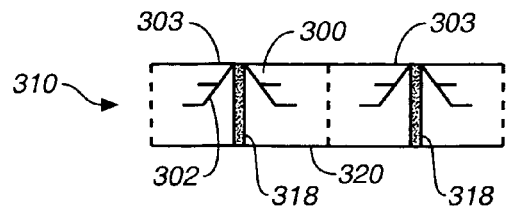
FIG._3F

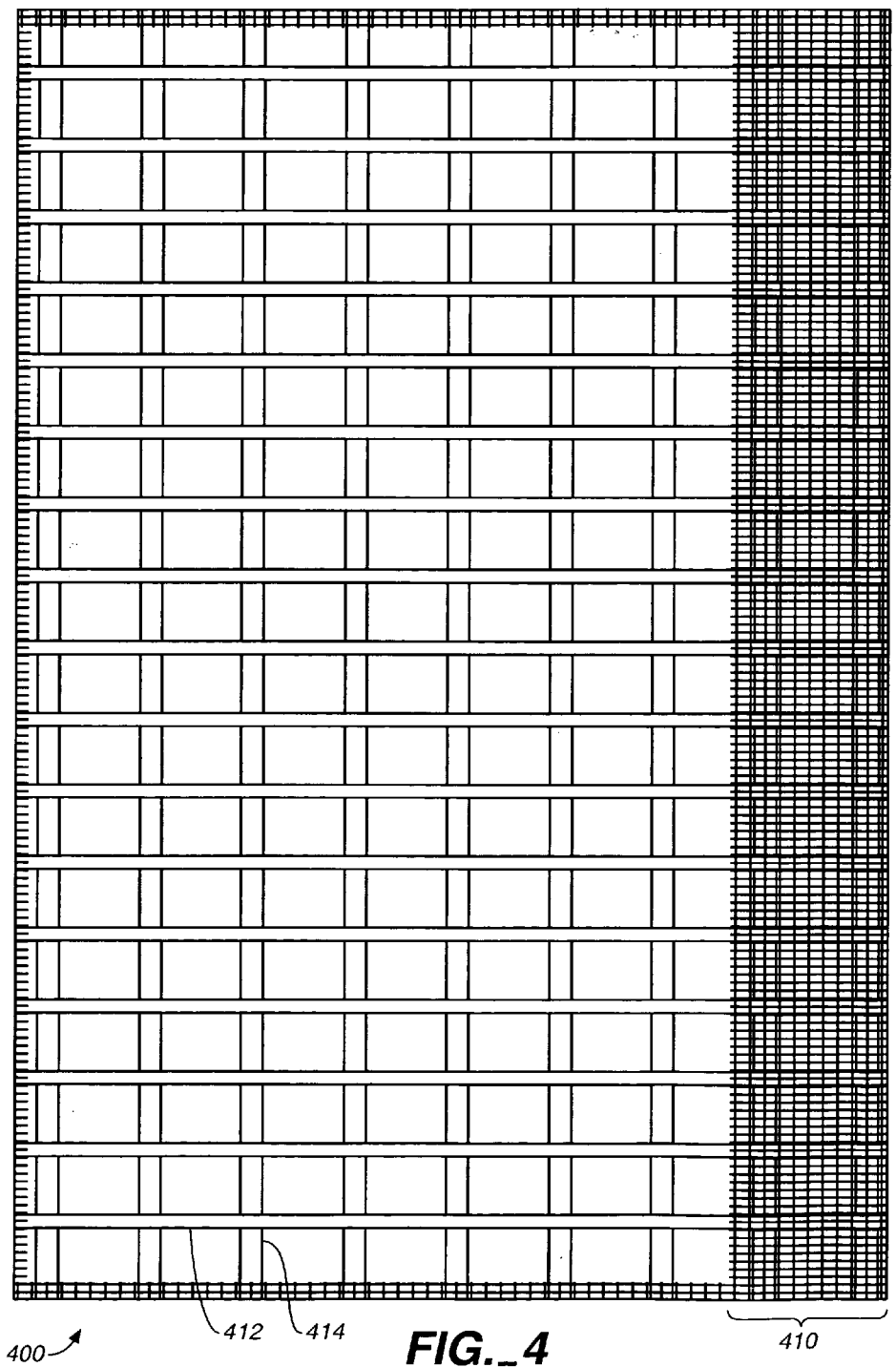
FIG._4

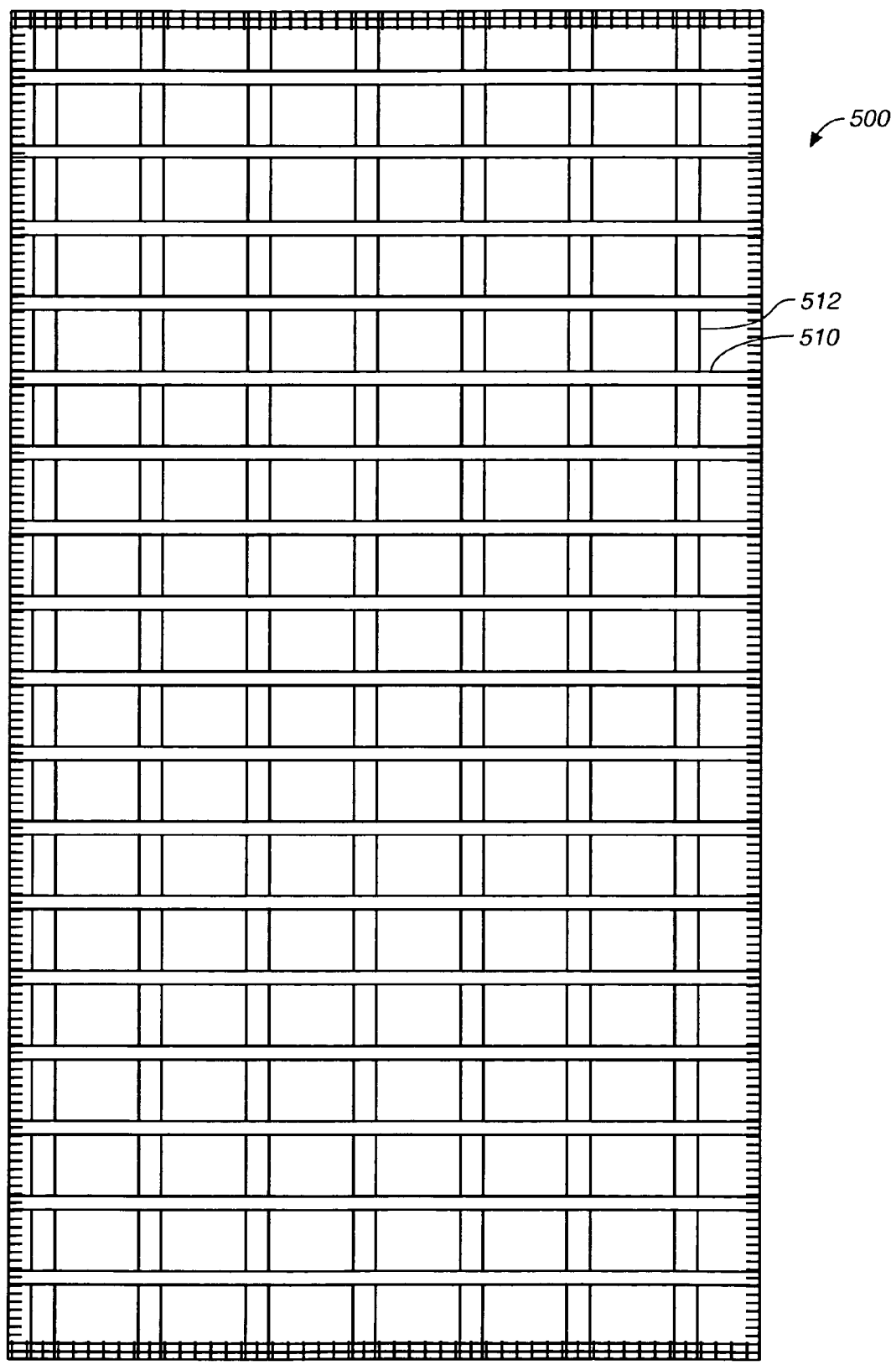
FIG._5

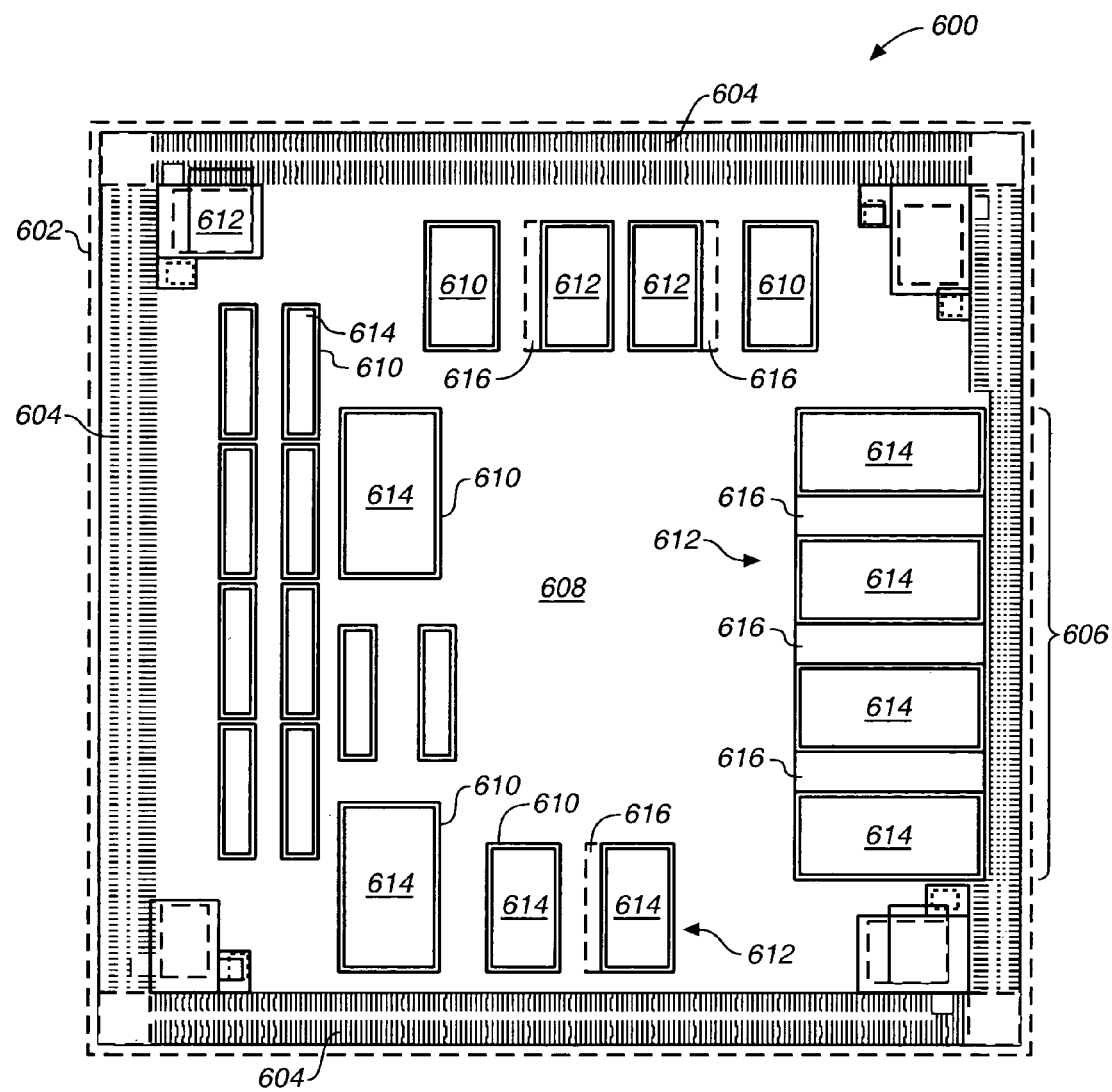
FIG._6

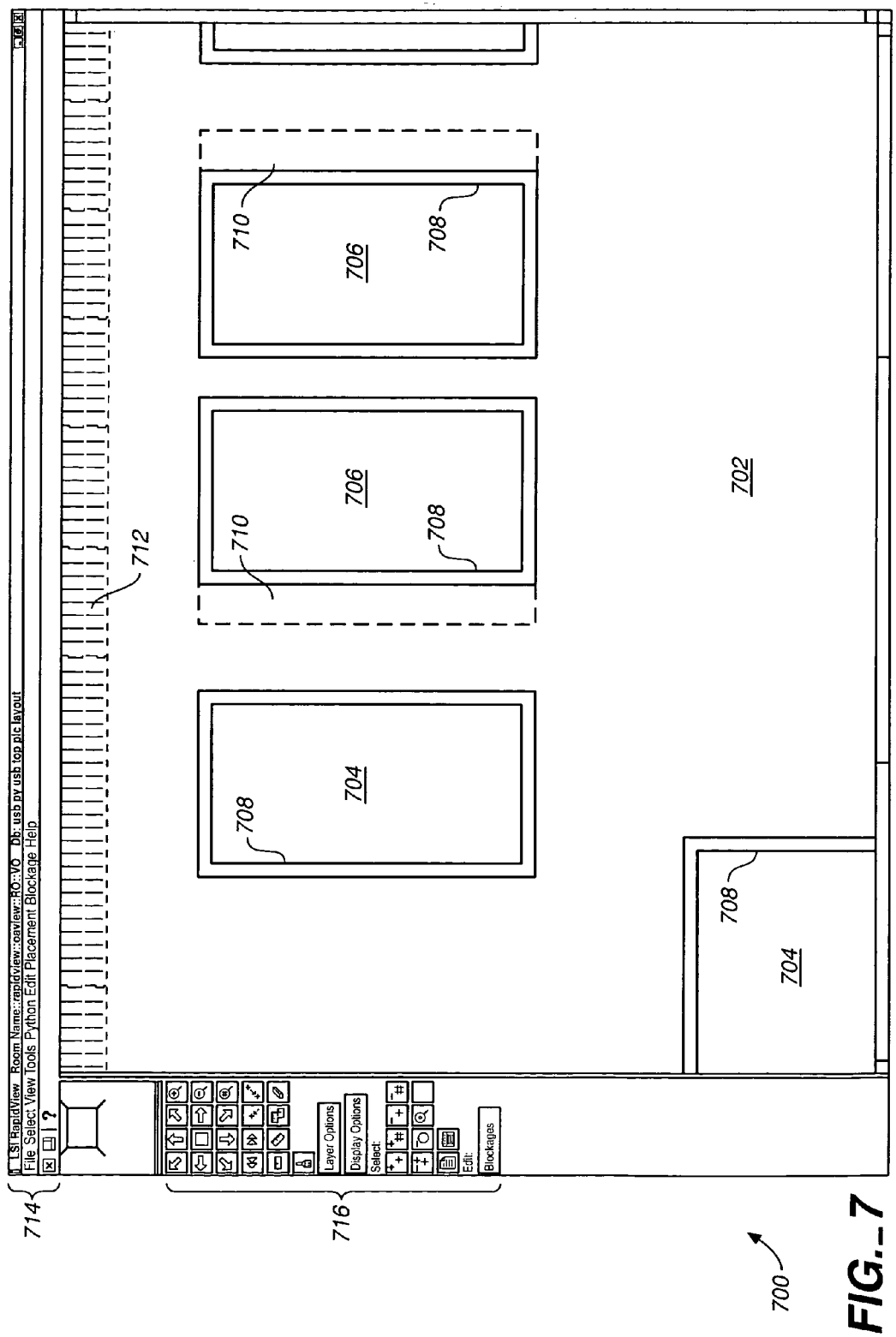
FIG._7

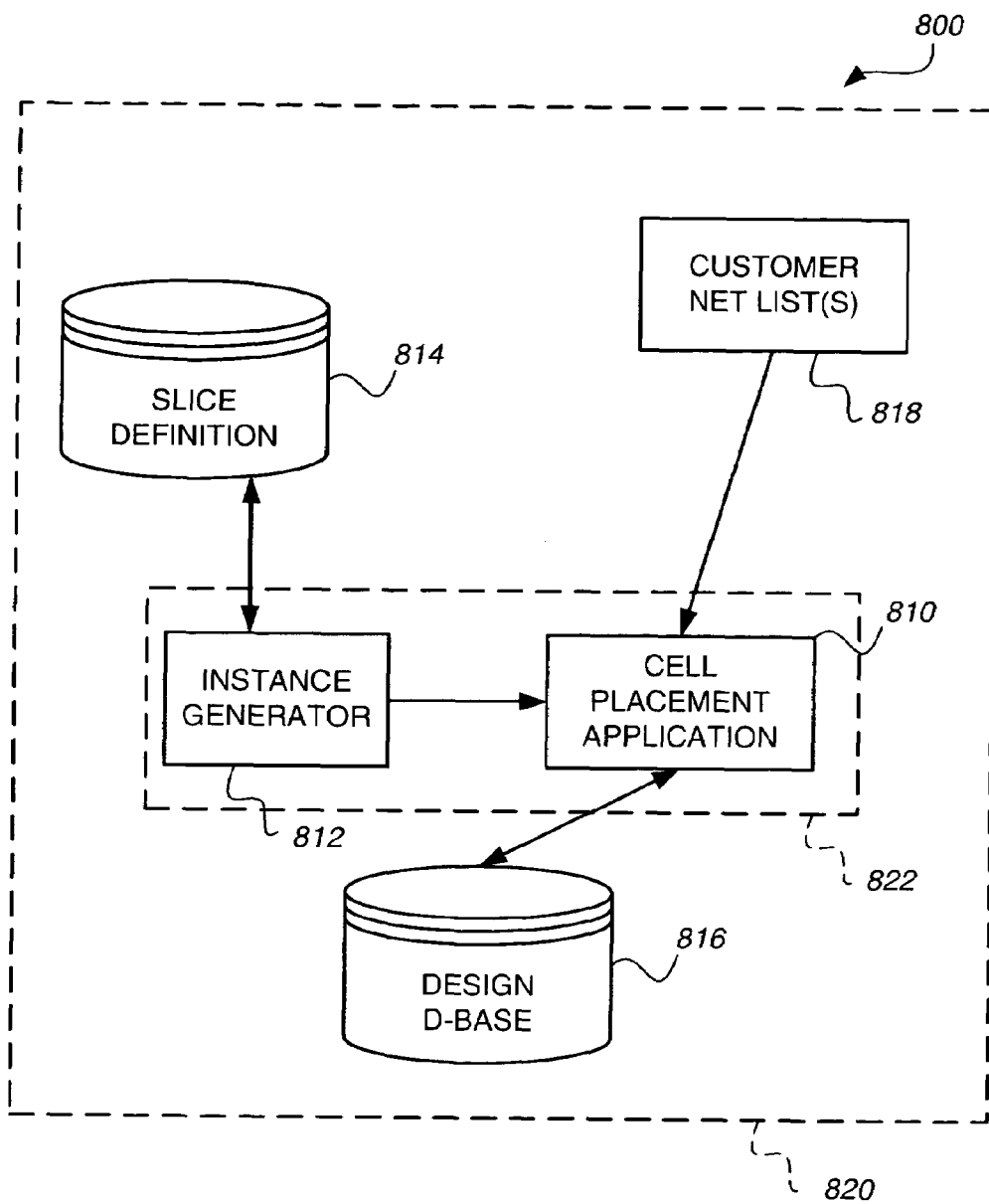
FIG. _ 8

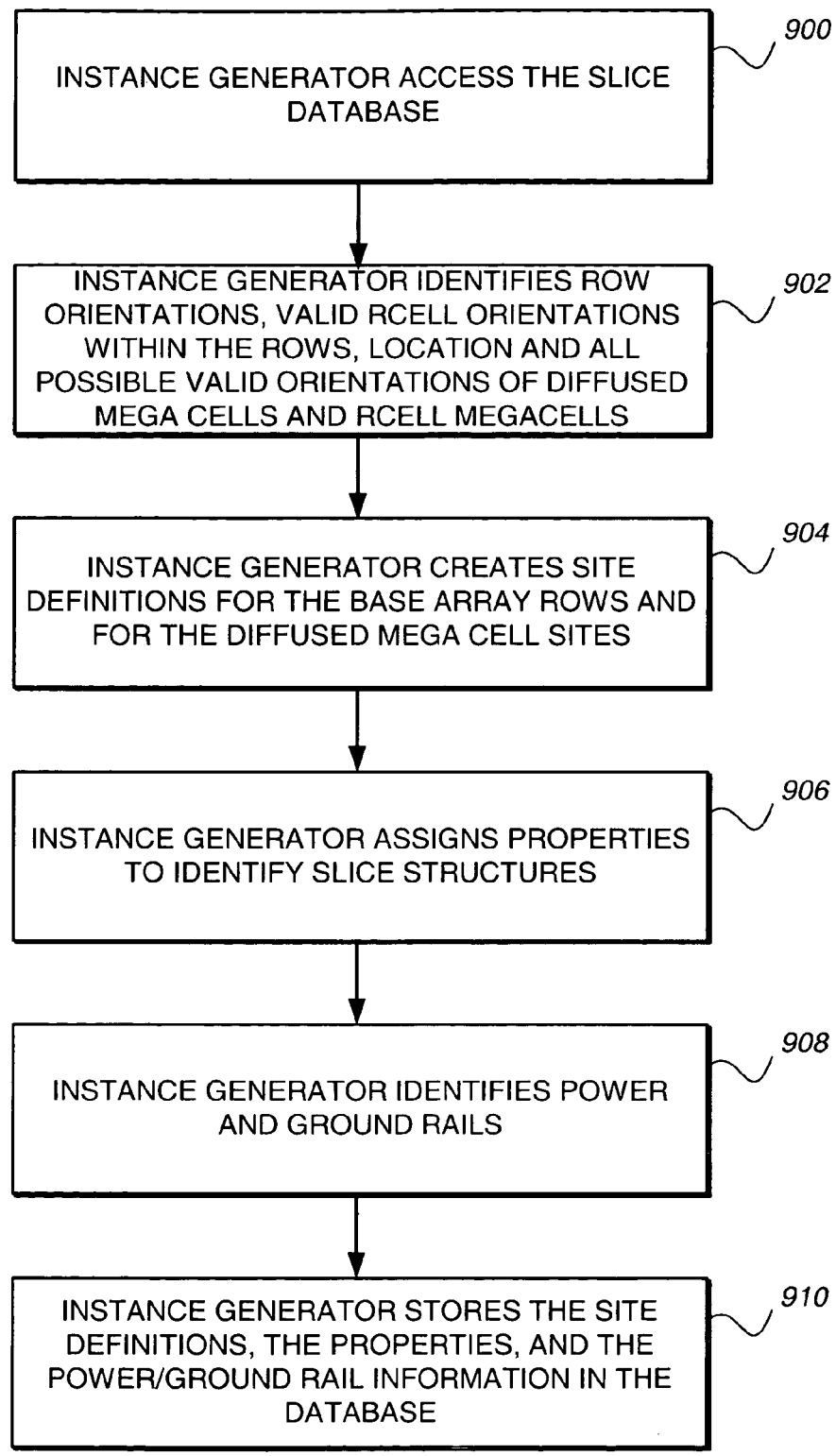
FIG._ 9

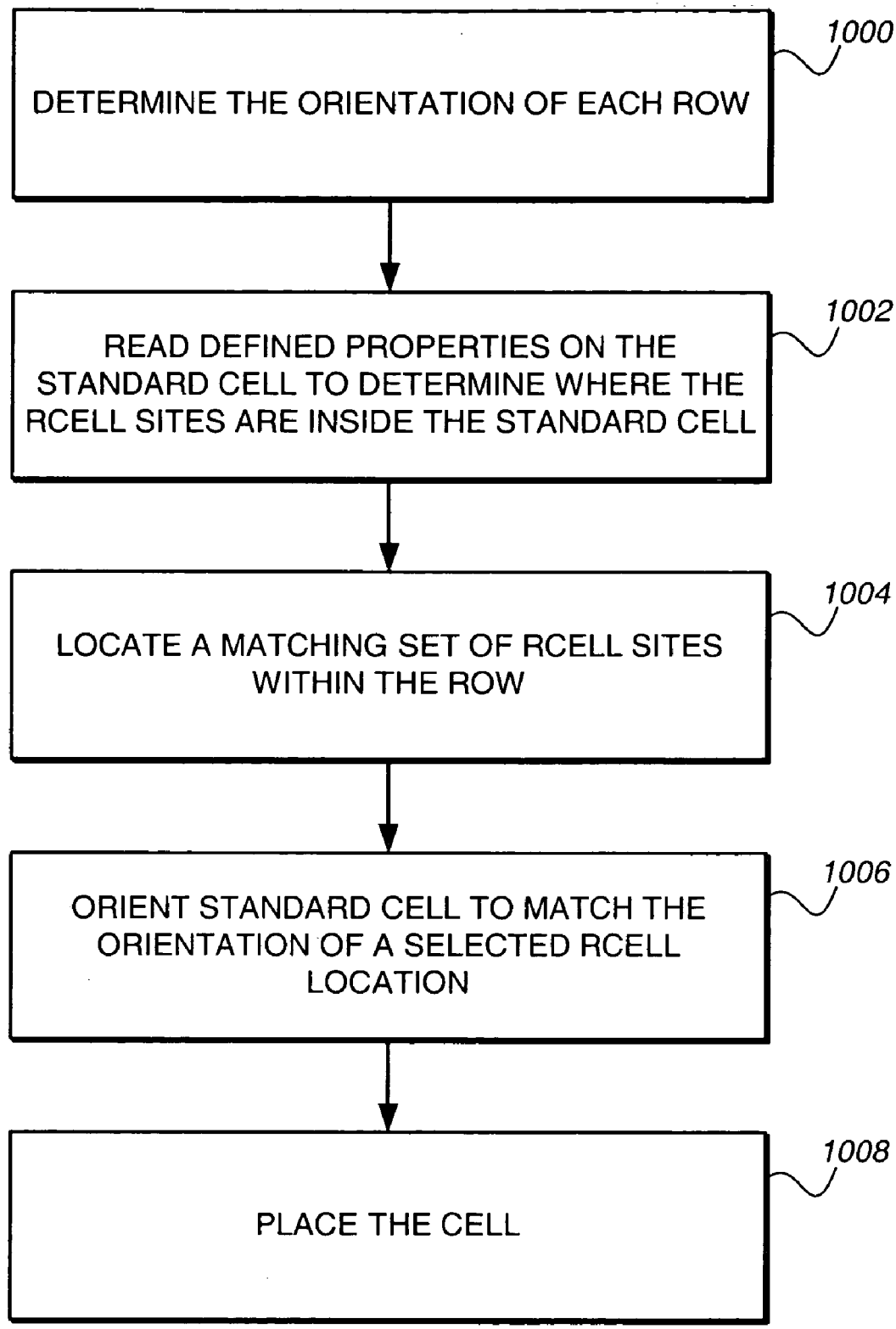
FIG._10

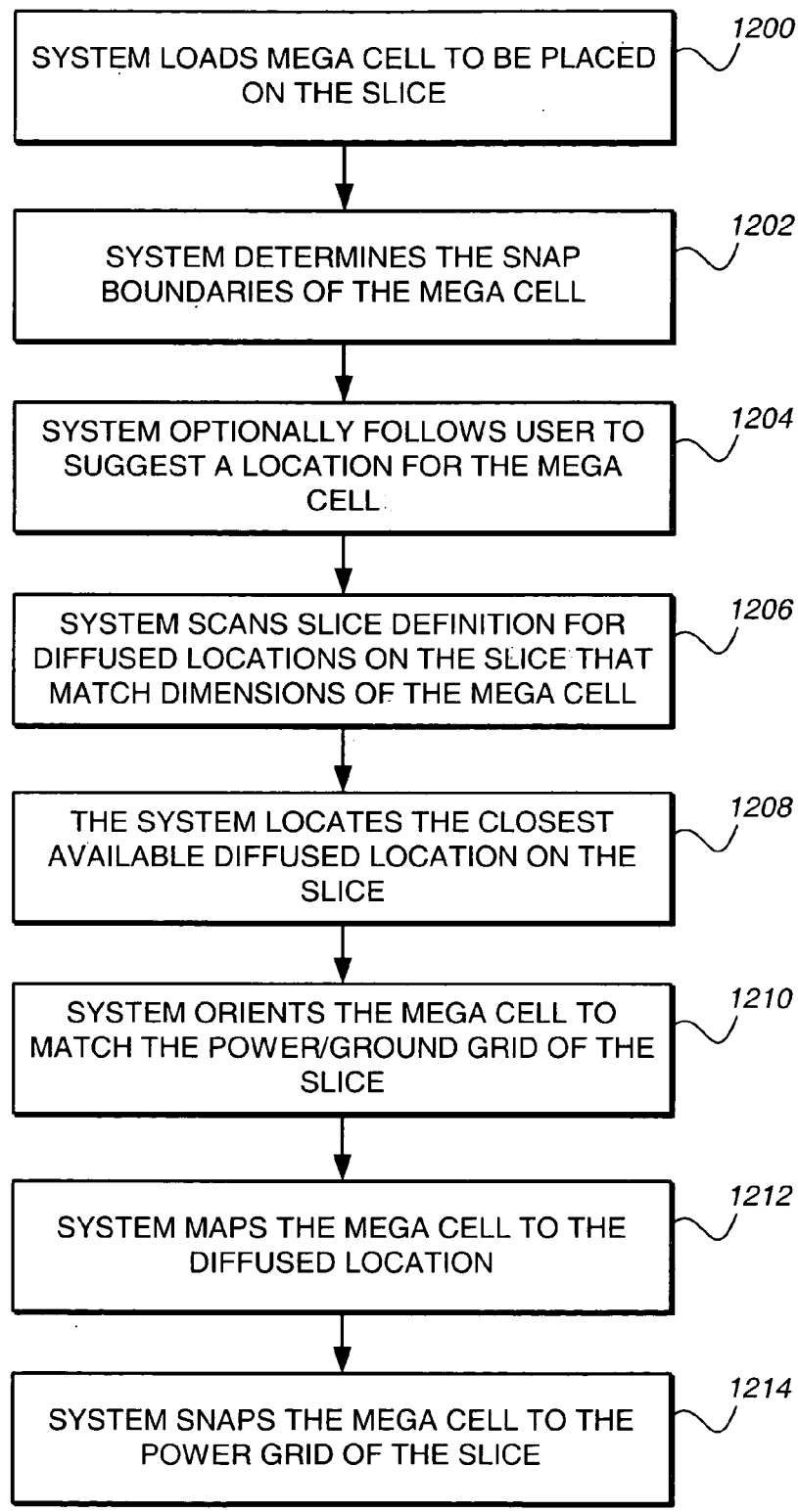
FIG._12

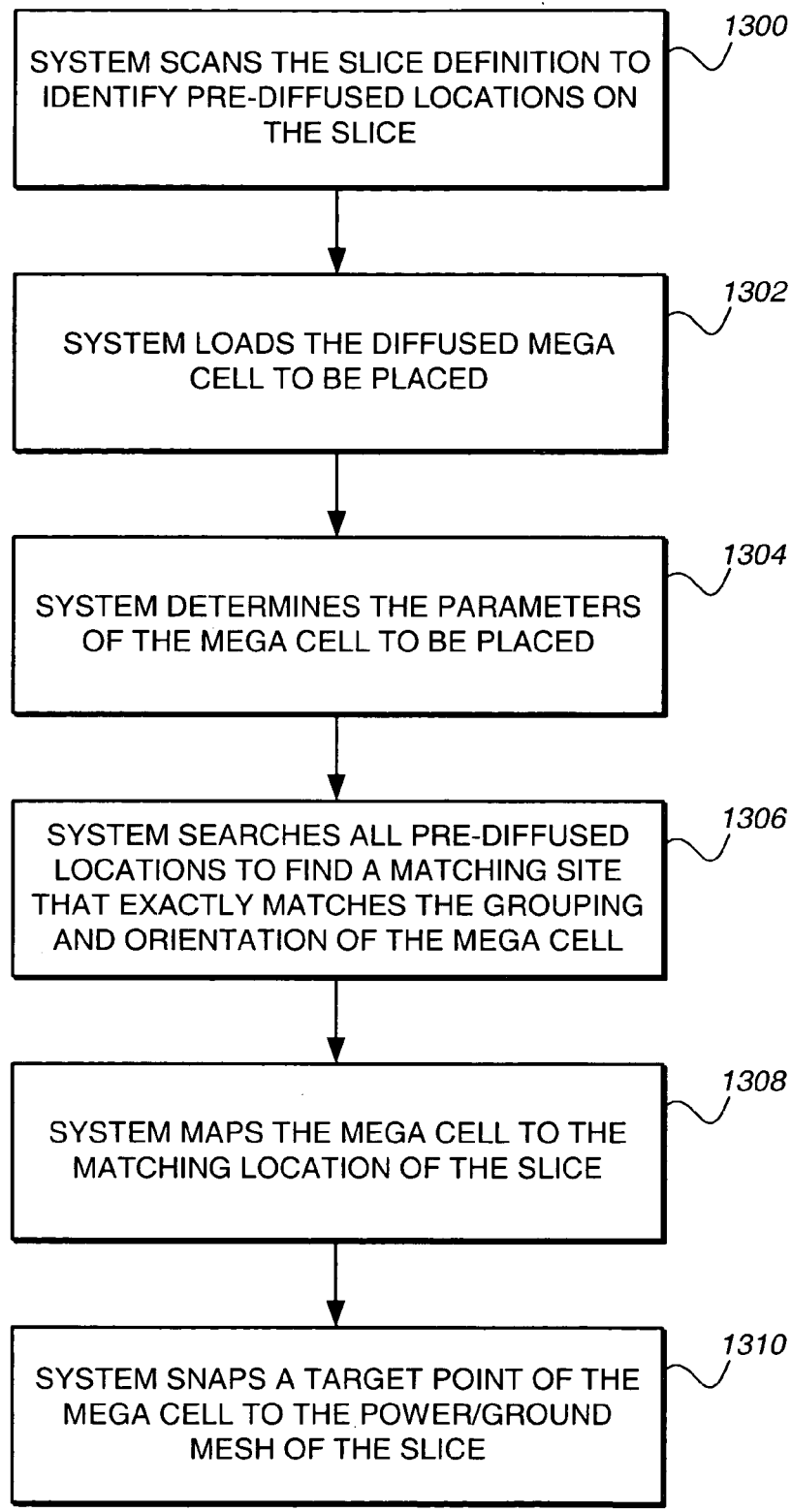
FIG._13

SYSTEM AND METHOD FOR MAPPING LOGICAL COMPONENTS TO PHYSICAL LOCATIONS IN AN INTEGRATED CIRCUIT DESIGN ENVIRONMENT

CROSS-REFERENCE TO RELATED APPLICATIONS

The present application is related to the following U.S. Patent Applications: U.S. patent application Ser. No. 10/435,168, filed May 8, 2003 (U.S. Pat. No. 7,020,852); U.S. patent application Ser. No. 10/318,792, filed Dec. 13, 2002; U.S. patent application Ser. No. 10/318,623, filed Dec. 13, 2002; U.S. patent application Ser. No. 10/334,568, filed Dec. 31, 2002 (U.S. Pat. No. 6,823,502); U.S. patent application Ser. No. 10/465,186, filed Jun. 19, 2003 (U.S. Pat. No. 6,959,428); U.S. patent application Ser. No. 10/335,360, filed Dec. 31, 2002 (U.S. Pat. No. 7,055,113); U.S. patent application Ser. No. 10/664,137, filed Sep. 17, 2003 (U.S. Pat. No. 6,910,201); U.S. patent application Ser. No. 10/459,158, filed Jun. 11, 2003 (U.S. Pat. No. 6,871,154); and U.S. patent application Ser. No. 10/245,148, filed Sep. 16, 2002 (U.S. Pat. No. 7,017,093), the contents of which are hereby incorporated by reference in their entireties.

BACKGROUND OF THE INVENTION

The present invention relates to computer-aided design of integrated circuits. More particularly, the present invention relates to a system and method for optimized placement and orientation of logical components to physical locations on a selected prefabricated silicon wafer to form an integrated circuit.

An integrated circuit, sometimes referred to as a "chip" or "microchip", is a semiconductor wafer on which thousands or millions of circuit elements, such as resistors, capacitors and transistors, are fabricated. On an integrated circuit, the thousands or millions of circuit elements are electrically interconnected and arranged to perform various functions. For example, depending upon the interconnection topology, transistors can be interconnected to perform boolean logic functions such as "AND", "OR", "NOT" and "NOR". Such an arrangement of transistors implementing a single boolean logic function is sometimes referred to as a "gate". Such combinations of transistors, gates and their wire interconnections are the fundamental building blocks of even the most complex integrated circuits.

Integrated circuits are generally fabricated on a thin, silicon wafer or substrate. Conventionally, semiconductor devices and electrical interconnections are formed using mask layers deposited on top of one another on the substrate. Each successive mask layer may have a pattern that is defined using a mask, which introduces a shape or a pattern on an underlying layer in a particular process step during fabrication. In particular, the pattern on the underlying layer may be processed to define various device features. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers of the substrate include the active areas of the semiconductor devices, such as diffusion regions and gate oxide areas, and desired patterns of the poly-silicon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

As device fabrication technology improves, ICs include more transistors in less space than ever before. As the number of interconnections have increased, the challenge of translating a circuit designer's intended "specific functionality" into a working IC has also increased, exponentially. In particular, since complex integrated circuits now contain large numbers of transistors, gates, semiconductors and interconnections, the circuits are more difficult to specify (interconnect) correctly. Additionally, the laws of physics that govern the behavior of such densely populated integrated circuits are much more subtle and complex than that of larger, less dense chips. Unanticipated and sometimes subtle interactions between the transistors and other electronic structures may adversely affect the performance of the circuit. Such issues increase the expense and risk of designing and fabricating integrated circuits.

Since many basic and even complex logical functions are used more than one time in a chip, and are often used in other chips as well, some commonly used logic functions have been reduced to "black box" functions or function blocks. Such function blocks can be optimized for particular frequencies, for power consumption or for various other design considerations. These function blocks can be incorporated in an integrated circuit; however, inclusion of function blocks necessitates testing to ensure that such blocks operate correctly and that they do not introduce timing and other problems to the rest of the circuit.

Manually assigning logical blocks to physical chip locations is a time-consuming, error-prone, and expensive task. Given that there may be millions of circuit elements on a given chip, this task may be impossible to complete in any reasonable amount of time through manual methods.

A class of computer programs, referred to as "placement tools", have been written to automate placement of circuit elements. However, such tools are typically used to place logical elements in a circuit design before the underlying silicon layers are formed. None of these tools are capable of handling the complex process rules required for legal placement of cells on specific, pre-manufactured diffused silicon slices.

SUMMARY OF THE INVENTION

A method according to one embodiment of the present invention maps logical components onto a pre-fabricated chip slice. A definition is received corresponding to the pre-fabricated chip slice. A logical function block is selected for placement onto the chip slice. The definition of the chip slice is searched for a location that is available for placement of the selected function block. The selected function block is mapped to the location.

An another embodiment, a function block is mapped to a chip slice layout. A slice definition of a chip slice is received. A logical block is selected for placement onto the chip slice corresponding to the chip slice layout. The slice definition is scanned for an open site on the chip slice with resources to match corresponding requirements of the logical block. The logical block is mapped to the open site.

In another embodiment of the present invention, a system for mapping logical components to a pre-fabricated chip slice includes a slice database, logical definitions of circuit components, and a software application. The slice database contains information relating to the slice. The logical definitions of circuit components correspond to physical circuit element to be mapped onto the slice. The software application adapted to search the slice database for legal cell locations on the slice corresponding to each logical definition, the software application is adapted to map the logical circuit component onto the slice based on identified legal cell locations.

BRIEF DESCRIPTION OF THE DRAWINGS

FIG. 1 is a simplified block diagram of a process according to one embodiment of the present invention.

FIG. 2 is a block diagram of a pre-fabricated, non-metallized microchip slice according to an embodiment of the present invention.

FIG. 3A is a graphical representation of a typical RCELL component.

FIGS. 3B-3F are simplified block diagrams illustrating various orientations of the RCELL component of FIG. 3A.

FIG. 4 is a graphical representation of a typical diffused Mega cell.

FIG. 5 is a graphical representation of a typical RCELL Mega cell component.

FIG. 6 is a graphical representation of a chip where the logical to physical mapping of the present invention has taken place and components have been assigned to physical locations on a selected chip slice.

FIG. 7 is screen shot of a design tool used to physically map the logical elements to the selected slice with a portion of the mapped slice of FIG. 6 visible within the display window.

FIG. 8 is a simplified block diagram of the system of the present invention.

FIG. 9 is a simplified flow diagram of an embodiment of instance generation according to a method of the present invention.

FIG. 10 is a simplified flow diagram of a method of cell placement according to an embodiment of the present invention.

FIG. 12 is a flow diagram of the method for optimized placement of an RCELL Mega cell on a prefabricated slice.

FIG. 13 is a flow diagram of the method for optimized placement of a diffused Mega cell on a prefabricated slice.

DETAILED DESCRIPTION OF ILLUSTRATIVE EMBODIMENTS OF THE PRESENT INVENTION

Figure 11:
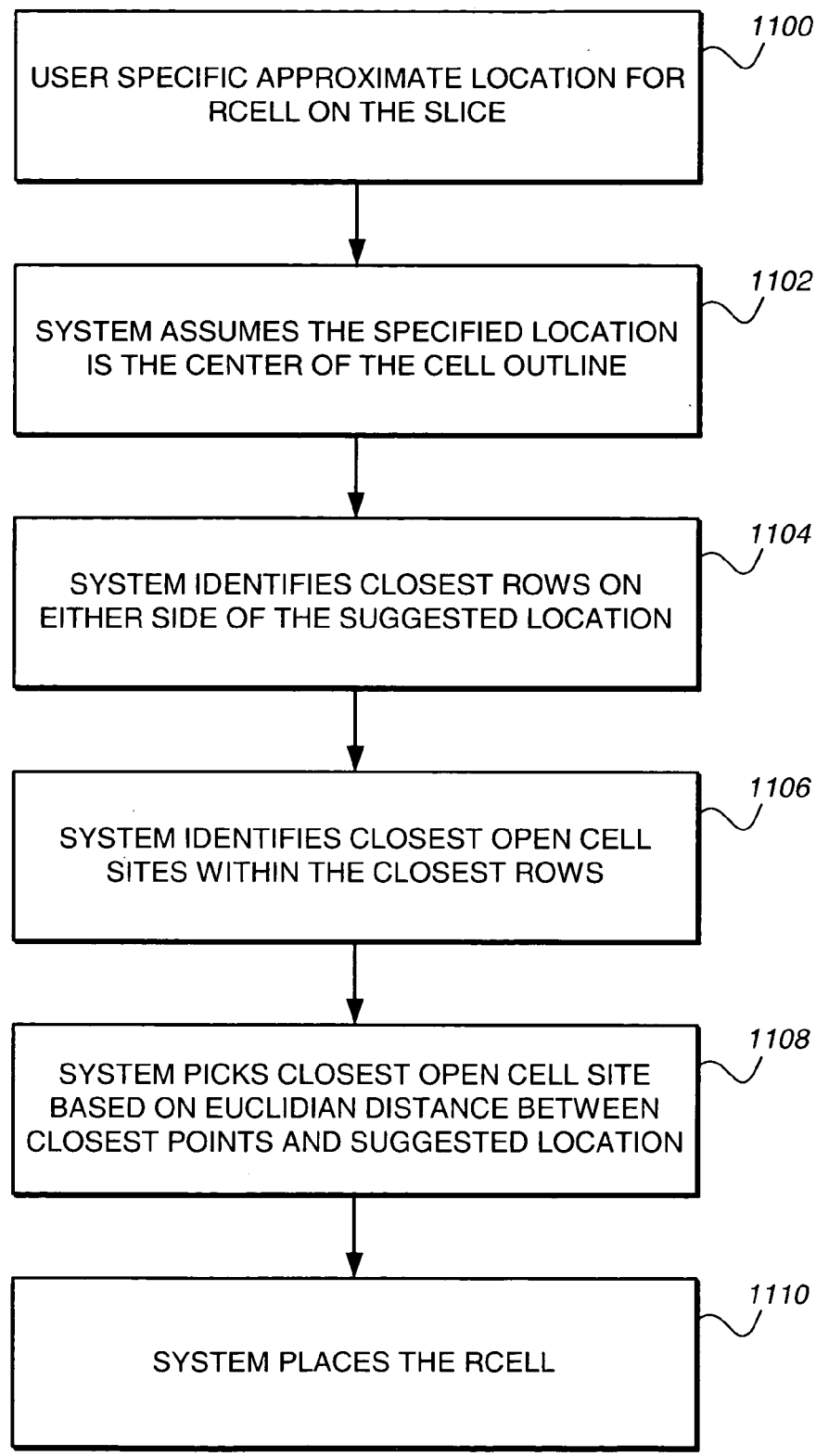
FIG. 11 is a flow diagram of the method for RCELL placement according to an embodiment of the present invention.

The present invention relates to a computer aided physical design process of an integrated circuit. For example, embodiments of the present invention are useful with the methods and processes described in U.S. patent application Ser. No. 10/335,360, filed on Dec. 31, 2002, and the other patent applications referenced above by serial number in the Cross-Reference to Related Applications, all of which are incorporated herein by reference in their entirety.

One technique for accelerating the integrated circuit design process involves utilization of existing logical and physical components, which are sometimes referred to as "function blocks" or "Intellectual Property" (IP) blocks. Another technique involves utilizing a prefabricated, unmetallized chip slice as the base layers for the design process, so that standardized Input/Output (I/O) circuitry, clocks, and the like need not be recreated for each integrated circuit in order to complete the circuit design.

As used herein, the term "slice" or "chip slice" refers to a pre-manufactured chip in which all silicon-based layers have been constructed, leaving the top metal layers to be completed. The slice is customizable by building on top of the pre-fabricated silicon-based layers.

One embodiment of the present invention is directed to a method for semiconductor platform design that proceeds in two stages. In the first stage, a slice is produced that incorporates standard circuit elements (such as configurable I/O circuitry) required for specific market or application needs. The slice is manufactured up to the point of metallization. Various slices can be designed and/or fabricated to meet specific needs. Such slices can be characterized by various parameters, including size, layout and placement of diffused areas, and the like to produce a slice definition, which can be used to map logical elements to the physical layout of the slice.

Customers select a slice definition and add their proprietary logic to the defined base layers using metal interconnect layers to transform the selected slice into an integrated circuit chip in a matter of weeks.

In particular, an embodiment of the present invention is directed to a software tool for mapping a logical design of a circuit to a physical implementation of the circuit. The software tool utilizes a slice database containing design data about the layout of one or more pre-fabricated slices in order to identify optimal locations and orientations for placement of various standard cells, logic blocks, and custom circuit elements onto the pre-fabricated slice.

In general, the silicon layers of a slice provide features, including diffused regions and transistor fabric, which are connected with customer-specific metallization patterns. In general, a prefabricated slice is selected, logical elements are added, and then custom circuit elements are added to form a customized integrated circuit.

FIG. 1 illustrates a progression of a typical slice 10. Slice 10 has diffused memory blocks 12, phase lock loop elements (PLLs) 14, proprietary or standard blocks 16, and a configurable transistor area or "fabric" 18. An input/output (I/O) ring 20 is made from configurable and dedicated I/Os according to specific needs. Thus, by selecting specific proprietary or standard blocks and by forming the I/O ring for specific implementations, entire families of slices can be created, which are aimed at particular applications.

The configurable transistor fabric 18 provides the basis for implementing custom logic elements. An RCELL is a basic unit within the transistor fabric 18. An RCELL is made up of specially sized "N" and "P" type transistors for maximum flexibility and performance. RCELLS are generally diffused in a regular pattern throughout the slice 10 and are arranged to implement efficiently both memory and logic structures. The RCELLS are configured by interconnecting the various components through multiple layers of metal to allow for the creation of a full range of logic functions. Transistors within the transistor fabric 18 are activated only when they are part of the implementation of a function used in the design, ensuring optimum power-efficiency.

The memory blocks 12 are diffused into each slice. The memory blocks 12 can include single-port and dual-port, high density, high-performance RAM blocks, which define a memory space configurable to meet a particular application's needs. Additionally, diffused memories can be combined with RAM memory spaces constructed from the transistor fabric 18, allowing a chip designer the flexibility to specify memory arrays of arbitrary width and depth.

The PLLs 14 are electronic circuit elements with a voltage-driven or current-driven oscillator that can be constantly adjusted to match the phase and the frequency of an input signal, and thus lock onto the signal. In addition to stabilizing a particular communications channel (keeping it set to a particular frequency), a PLL 14 can be used to generate a signal (such as a clock signal), modulate or demodulate a signal, reconstitute a signal with less noise, or multiply or divide a frequency.

The term "blocks" 16, sometimes referred to as "cores", "Intellectual Property" or "IP blocks", typically refers to re-usable circuit blocks, available for use in larger circuit designs. The blocks 16 are typically standard circuit elements that have been tested and optimized, and often such blocks 16 are proprietary and protected by patents and copyrights. Such blocks or cores can be used as black box functions or modules for implementation in a circuit design.

Blocks 16 may be hard, firm or soft. A hard block 16 is diffused at optimal locations within the slice, using cell-based elements for maximum performance and density. Firm blocks 16 are preconfigured for high performance and have known characteristics. Firm blocks 16 may be located anywhere within the transistor fabric 18 of the slice. Soft blocks are incorporated into the slice as functional blocks and are implemented in the transistor fabric 18 like any other block, but with specific timing criteria to ensure their functionality.

Generally, dedicated I/Os are diffused in the slice 10 where industry standards dictate and performance and power provide a justification. Since chip designers typically require some flexibility, all slices 10 have configurable I/Os, which are capable of operating with the most commonly used signaling standards, such as LVTTL, LVDS, HSTL, SSTL, and the like. Using a software-based general I/O tool, the designer can specify the industry standard as well as the voltage levels, drive strengths and pin locations. These parameters cause the general I/O tool to create customized metal patterns that connect uncommitted transistor networks in an I/O region of a slice 10 in order to implement all required buffer types.

As shown, additional elements 22 can be selected and added to the pre-configured slice 10. Generally, the elements 22 are stored in one or more databases, and may be proprietary or open architecture, depending on the specific implementation. Typically, it is desirable that even proprietary blocks 16 work with existing standards, though that is not always necessary.

Finally, the customer specific logic 24 (custom silicon) is added to the slice 10. Specifically, the customer provides or designs custom logic 24, which is mapped to the slice 10.

As previously discussed, the design flow of an embodiment of the present invention includes two basic steps, which can be broken out into multiple steps. From a broad perspective, an embodiment of the present invention involves selecting a slice 10 and adding circuit elements to that selected slice. Another embodiment involves selecting a slice 10 from a family of slices, adding standard cells and standard blocks 16 to the slice 10, and adding custom silicon and custom elements 24 onto the slice to form an integrated circuit.

As previously discussed, placement of the logical elements can be difficult. In order to fully understand the operation of the present invention, it is important to put the invention in context.

FIG. 2 illustrates an enlarged view of an embodiment of a slice 10. The slice 10 represents the base layers for the integrated chip. Specifically, the base layers for the standard cells, diffused Mega cells, RCELLS and RCELL Mega cells have already been assigned fixed physical locations on the base layers. Therefore, it is desirable to identify a physical location for an instance of the design for a given slice that maps correctly to a pre-manufactured image of the given slice.

As shown, the slice 10 has diffused memory blocks 12, core blocks 16, transistor fabric 18, and configurable I/Os 20. In this example, the core blocks 16 include a Gigblaze x8 block 26, a Gigablaze x4 block 28, and two HyperPHY standard x20 cores 30, which are commonly available from LSI Logic Corporation. However, any other type of standard cells, logic blocks, or other circuit elements can be used in slice 10. In this embodiment, the PLL 14A is configured as a clock generator, and a section of the configurable I/Os 20 has been set aside as control I/Os 32. Finally, pin-outs 34 are provided around the periphery of the slice 10 for interfacing with electrical connections to a device, a printed circuit board, or other chips (not shown).

The pre-fabricated slice 10 can be formed with any number of pre-diffused blocks 12, with custom or core blocks 16, with various PLLs 14, and has configurable I/Os 20 to provide a versatile base on which the integrated circuit can be formed. Additionally, the transistor fabric 18 allows a designer a great deal of flexibility for adding various circuit elements.

Traditionally, one of the problems facing chip designers (in addition to the shear complexity of routing all of the interconnections correctly) is the problem of how best to orient and place component elements onto the chip. This problem is exacerbated when the underlying substrate is a pre-fabricated silicon slice 10 having pre-diffused areas and core IP blocks.

One embodiment of the present invention provides a technique for identifying the layout and structure of the slice 10 and for identifying legal site locations and orientations for RCELLs, RCELL Mega cells, and diffused Mega cells. In order to fully understand the placement algorithms and the method described herein, it is important to understand conceptually the various elements that are placed on the slice 10.

FIG. 3A is a layout diagram of a typical RCELL component 300. The layout diagram specifies the base layer arrangement and interconnections within the RCELL component 300. The RCELL component 300 has a row height (h) and column width (w). An orientation marker 302 is shown in phantom to indicate the direction and orientation of the RCELL component 300 relative to an origin 303 in FIGS. 3B-3F. Generally, the arrangement and orientation of the RCELL 300 is determined in part by the power/ground grid, which is fabricated onto the slice. Each RCELL 300 is arranged on the slice to correspond to the power grid. However, it can work either way, meaning that the power grid can be determined according to the RCELL layout.

The orientation marker 302 (shown as a slanted F-shaped mark in phantom) indicates the direction and orientation of the cell 300 relative to an origin 303. Generally, the cells 300 may be oriented back-to-back in a row or facing the same direction within a row. Alternatively, the row of cells can be flipped upside down.

In FIG. 3B, a row 310 of cells 300 are shown in a simplified block diagram. Within the row 310, the cells 300 are oriented in a back-to-back configuration, with the back-to-back configuration beginning with cells two and three in the row. RCELL component 300 is shown facing in the same direction as in FIG. 3A, while component 300' is shown in a flipped orientation. A dashed line is provided to mark the separation between RCELLS. As shown, the first cell site 312 and the second cell site 313 in row 310 are not back-to-back, but the second and third cell sites 313 and 314, and the fourth and fifth cell sites 314 and 315 and so on are paired in a back-to-back configuration. In this arrangement of cells, the power/ground grid can be arranged such that the power lines 318 are drawn between back-to-back cells. The corresponding ground lines 320 may be drawn along one or both sides of the row 310. If the cell sites are positioned back-to-back within a row 310, the power grid lines 318 can be arranged approximately two cell widths apart.

FIG. 3C illustrates a row 310 of cells 300 arranged so that they are all oriented in the same direction (meaning that the cell sites are not back to back within the row 310). In this arrangement, the power grid is spaced such that the power lines 318 are spaced apart by a width of a cell 300. In other words, a power line 318 must be drawn between each cell site. In this embodiment, the ground grid 320 is drawn along the top of the row 310.

FIG. 3D illustrates a row 310 of cells 300 where the first cell is flipped. In this embodiment, the power grid lines 318 are drawn such that two cells 300 are connected to each power grid line, and the grid lines are spaced apart by approximately the width of two RCELLS. As shown, the power grid lines 318 are drawn between the first and second cell sites 312 and 313, between the third and fourth cell sites 314 and 315, and so on.

FIGS. 3E and 3F illustrate inverted rows 310 of cells 300. FIG. 3E shows a row having an orientation similar to the first three cell sites of FIG. 3B, but oriented such that the row 310 is flipped upside down. FIG. 3F shows a row having an orientation similar to the first three cells of FIG. 3D, but oriented such that the row 310 is flipped upside down. Since both FIGS. 3E and 3F illustrate rows 310 having back-to-back configurations, the power grid lines 318 in both figures are positioned between back-to-back cells, and can be spaced two cell widths apart.

Generally, it is desirable to orient the cells and snap them to the power/ground grid in such a way as to minimize the number of power grid lines required. Thus, in a preferred embodiment, the cells are oriented back-to-back so that fewer power grid lines are needed.

Within the legalizing and placement algorithm, the origin 303 is mapped to the power/ground grid, such that the origin 303 is positioned at an apparent intersection of a power line with a ground line. It will be understood by a worker skilled in the art that the power and ground lines are insulated from one another, such that no actual intersection between the power and the ground lines exists.

In general, the chip slice may contain an array of RCELL base components, arranged in horizontal rows. The RCELL is the smallest component that can be placed on the chip. A "standard cell" is a primitive logic function realized by one or more RCELL components that will fit in one horizontal row. An RCELL Mega cell is a complex logic function, which is composed of a number of RCELLs and which may span multiple rows. The RCELL Mega cell may be placed in any unused location on the slice. Diffused Mega cells are complex logic functions that may span multiple rows. Diffused Mega cells are not necessary made up of RCELLS. The base layers for the diffused Mega cells are pre-manufactured as diffused areas located at one or more fixed positions on the slice.

FIG. 4 is an illustration of a typical diffused Mega cell 400. While a typical RCELL is approximately four cells or four transistors, a Mega cell may be on the order of 10,000 to 100,000 gates. A diffused Mega cell is a Mega cell that requires a pre-diffused area on the slice. A pre-diffused area is an area made or adapted to accept only particular types of elements. In general, a pre-diffused area on the slice is an area of the slice that has been processed or otherwise prepared for particular circuit structures. For example, a pre-diffused area can be formed for use as a memory block.

As previously indicated, Mega cells are not necessarily made up of RCELLS 300. This embodiment of a diffused Mega Cell includes an RCELL section 410 that is snapped to a power/ground grid formed of a ground lines 412 and power lines 414. Viewed closely, the power lines 414 and ground lines 412 are partially visible between the closely clustered RCELL section 410. A diffused Mega Cell may span multiple rows and columns, and can only be placed in an unused pre-diffused location on the slice.

FIG. 5 illustrates a typical RCELL Mega cell component 500. An RCELL Mega cell 500 is a complex logic function, which is composed of a number of RCELLS, and which may span multiple rows. An RCELL Mega cell can be placed in any unused location on the slice. As shown, the RCELL Mega cell 500 includes a grid of power lines 510 and ground lines 512 adapted to mate with a corresponding power grid of a slice.

Referring now to FIG. 6, a chip is shown where the logical to physical mapping of the elements of FIGS. 3-5 has already been performed. First, a designer selects a prefabricated chip slice from a selection of pre-defined slice definitions. The selection is based on the slice definition that most closely matches the requirements of the end product. Once the slice has been selected, the designer selects IP blocks (RCELLS 400, diffused Mega cells 500, and RCELL Mega cells 600) from a logic library such as that maintained by LSI Logic Corporation of Milpitas, Calif. and/or from logic libraries maintained by an open source organization. The designer the selects custom or proprietary IP blocks for addition to the slice. Such proprietary IP blocks may be accessed from their netlist definitions or synthesized into a standard format. Finally, an embodiment of the present invention may then be operated to physically map the selected IP blocks onto the slice in legal and optimized locations and orientations.

FIG. 6 illustrates a chip 600 where the logical to physical mapping has taken place, and the IP components have been assigned to physical locations on the slice 602. In this embodiment, the chip 600 has a plurality of I/Os 604 along its peripheral edges. Configurable I/Os 606 extend along a portion of one side. Finally, RCELLS, which are too small to be visible on the transistor fabric 608, diffused Mega Cells 610, and RCELL Mega Cells 612 have been mapped to the chip 600.

In general, RCELLs can be mapped to the transistor fabric 608 at any unused location. Diffused Mega Cells 610 are mapped to unused locations where the underlying slice 602 was diffused. Diffused areas 614 are generally visible as a slightly smaller outline within the mapped diffused Mega cell 610 structure. Finally, the RCELL Mega Cells 612 are mapped to diffused locations 614 on the slice 602; however, RCELL portions 616 of the RCELL Mega cell 612 (such as element 410 in FIG. 4) may extend beyond the edge of the diffused location 614 and into the transistor fabric of the slice 602. The overlapping portion of the RCELL Mega cell 612 is shown in phantom. Thus, the RCELL Mega cells are mapped to diffused locations 614 on the slice 602 that are unused and that have unused transistor fabric directly adjacent to the diffused location 614. This structure allows the designer flexibility in adding custom transistor logic to a circuit element that also requires a diffused area.

FIG. 7 is a screen shot of the circuit chip layout of FIG. 6 within a graphical window 700 of a design tool according to an embodiment of the present invention. The view is a magnified view of the chip of FIG. 6. As shown, the circuit elements are magnified such that individual RCELLs 702 between the larger diffused Mega cells 704 and RCELL Mega cells 706 are visible. The boundaries of the diffused areas 708 are visible within the Mega cell structures 704, 706. The RCELL portions 710 of the RCELL Mega cells 706, which extend beyond the borders of the prediffused areas 708, are visible. Finally, I/Os 712 are visible just below a menu bar 714 of the graphical user interface.

In this embodiment, the graphical user interface provides a group of buttons 716 for interacting with the elements displayed. Specifically, buttons 716 are provided for changing the magnification, for changing display options, for switching between layers of the design, for connecting elements, for adding elements, and to provide access to net lists and the like.

FIG. 8 illustrates an embodiment of the present invention. As shown, a system 800 for mapping logical circuit elements to physical locations on a pre-fabricated slice includes a cell placement application 810 and an instance generator 812. The application 810 has access to a slice definition database 814 and a design database 816, as well as a customer netlist 818. A customer netlist 818 typically includes the circuit definitions and rules corresponding to the customer's custom circuit design.

The slice definition database 814 includes data related to the prefabricated microchip slice, including size and location of diffused areas, I/O locations and layout, location and definitions of any pre-fabricated circuit components, IP blocks, and the like. The design database 816 stores the logical-to-physical mapping of the completed chip design.

As shown, the entire system can be stored on a single machine (indicated by dashed-line 820), or could be distributed on a network. The application 810 and instance generator 812 could be a single compiled application (indicated by dashed line 822) or a plurality of software tools coordinated to function together to map the logical elements to the physical slice.

The specific implementation of the application 810 is secondary to its functionality. While an intuitive graphical user interface is desirable, it is not necessary to implement the method of the present invention. Command line type software applications could similarly to be used to implement some of the algorithms of the present invention. However, a graphical user interface that provides a graphical view of the circuit layout is desirable because it provides an intuitive interface for a designer to understand the particular implementation.

Generally, after the base layer slice is completed, the slice definition database 814 is updated to store information about the pre-fabricated slice, including information about the base RCELL array structure. Once these elements have been updated into the slice definition database 814, the instance generator 812 abstracts the slice definition stored in the slice definition database 814 in such a way that the data can be used subsequently by a customer for their own unique design. This process is referred to as instance creation.

FIG. 9 is a flow diagram illustrating one embodiment of the process of instance generation. The instance generator 812 accesses the slice database 814 (step 900). The instance generator 812 identifies row definitions, valid RCELL orientations within the rows, and the location and all possible valid orientations of diffused Mega cells and RCELL Mega cells (step 902). From this information, the instance generator creates site definitions for the base array rows and for the diffused Mega cell sites (step 904). The instance generator assigns properties to identify slice structures (step 906). The properties can be used to identify those structures during cell placement.

The instance generator identifies the location and spacing of power and ground rail structures (step 908). Finally, the instance generator stores the site definitions, the properties, and the power/ground rail information in the database (step 910). This stored information represents an abstraction of the slice definition, which can be used by customers to create unique designs, and the process can be referred to as "instance creation."

Referring now to FIGS. 10-13, the information generated by the instance generator is used to auto-place (or auto-interactively place) RCELLs (FIG. 11), RCELL Mega cells (FIG. 12), and diffused Mega cells (FIG. 13) onto the slice based on legal orientations determined by the software application (FIG. 10). In some embodiments, the cell placement tool is a software application that may allow the designer to specify an approximate location for the particular cell. In another embodiment, the software application may simply choose an optimal location from available unused locations.

In each instance, the cell placement application searches the base layer definitions created by the instance generator to identify an open, acceptable location for a cell, and uses the properties added to the rows by the instance generator to determine the proper orientations for the cell.

FIG. 10 shows a simplified flow diagram illustrating one possible flow for identifying the orientation and location of an open cell site for placement of a cell.

As previously discussed, the arrangement of RCELLs within a row of a particular implementation may vary (Normal or upside down, first cell flipped or not flipped, and back-to-back or all facing the same direction). To place an RCELL for example the system of the present invention utilizes chip properties previously defined by the instance generator to determine the orientation of each row based on the "Normal" or "Flipped" orientation (step 1000). Then for the cells within each row, the system reads the previously defined properties of the standard cell to determine where the cell sites are inside the standard cell. (step 1002). The system locates a matching set of open cell sites within the row (step 1004). The system orients the standard cell to match the orientation of a selected open cell site (step 1006), and places the cell (step 1008). An excerpt of pseudo code for finding the nearest non-flipped cell site within a given row based on the properties is provided below.

```
# The following returns the lower left X
  location of the nearest non-flipped acell site
# within the given row
def
FindNearestNonFlippedAcellSite(self,x_loc,row):
        if (self.cell_sites_back_to_back):
            if ((row.rowtype == "Normal") and
            (self.row_normal_cell_site_flipped_first))
            or ((row.rowtype == "Flipped")
            and
            (self.row_flipped_cell_site_flipped_first))):
                non_flip_acell_site        =
                    self.SnapNearestOdd(x_loc,self.acell_width,
                    row.outline.llx)
            else:
```

-continued

```
        non_flip_acell_site    =
            self.SnapNearestEven(x_loc,self.acell_
            width,row.outline.llx)
    else:
        non_flip_acell_site    =
            self.SnapNearest(x_loc,self.acell_width,
            row.outline.llx)
    return non_flip_acell_site
```

The above code returns a non-flipped cell site location to the calling function. The next code block snaps the cell element to the power/ground grid of the slice.

```
# The following snaps the orig_loc to the
nearest multiple of the grid.
# The grid is defined by "grid" and "offset"
variables
def SnapNearest(self,orig_loc,grid,offset):
    ... .
# The following snaps the orig_loc to the
nearest odd multiple of the grid.
# The grid is defined by the "grid" and "offset"
variables
def SnapNearestOdd(self,orig_loc,grid,offset):
    ... .
# The following snaps the orig_loc to the
nearest even multiple of the grid.
# The grid is defined by the "grid" and "offset"
variables
def SnapNearestEven(self,orig_loc,grid,offset):
    ... .
```

The RCELL orientation of the first RCELL is assigned such that if the power and ground lines of the RCELL match up with those of the corresponding slice. In this manner, by snapping the RCELL to the returned cell site, the RCELL is guaranteed to be over a legal base array site. In other words, the power and ground mesh of the RCELL is oriented and aligned to match precisely with the power and ground mesh of the slice.

Referring now to FIG. 11, the method of auto-interactively placing RCELLs may allow a user to specify an approximate location for the RCELL cell. The pseudo code above provides an overview of the algorithm used by the application. As shown, a user specifies an approximate location for the RCELL cell (step 1100). The system assumes that the specified (suggested) location is the center of the cell outline (step 1102). The system identifies the closest rows (step 1104), iteratively. The system identifies the closest open cell sites within the closest rows (step 1106). The system picks the closest open cell site based on an Euclidean distance between the suggested point and the closest identified points (step 1108). The system places the RCELL (step 1110).

FIGS. 12 and 13 involve steps similar to that of FIG. 11; however, within the cell definition, the number of legal sites available for diffused Mega cells and RCELL Mega cells are limited by the slice definition. Thus, though the system can search iteratively for the locations, fewer sites must be scanned.

Typically, Mega cells are created using specific generation tools of a integrated circuit design suite, such as that disclosed in U.S. patent application Ser. No. 10/335,360 filed Dec. 31, 2002 and entitled "A SIMPLIFIED PROCESS TO DESIGN INTEGRATED CIRCUITS", which is incorporated herein by reference in its entirety. The generation tools construct the power and ground mesh within the Mega cell to exactly match the power/ground mesh on the corresponding slice, in a process that is not the subject of the present invention.

Referring to FIG. 12, the system loads into memory the definition of the RCELL Mega cell that is to be placed onto the slice (step 1200). The system determines the snap boundaries of the RCELL Mega cell (step 1202). Optionally, a user may provide a suggested target on the slice for the RCELL Mega cell (step 1204). The system then scans the slice definition for diffused locations on the slice that closely match the selected RCELL Mega cell (step 1206), and that are closest to the suggested location (if the user suggestion option is enabled). The system locates the closest available diffused location on the slice (step 1208). The system orients the RCELL Mega cell to match the power/ground grid of the cell to that of the slice (step 1210). Finally, the system maps the RCELL Mega cell to the diffused location (step 1212), and snaps the target point of the RCELL Mega cell to the power grid of the slice (step 1214). Since the power/ground mesh of the RCELL Mega cell is lined up with the power/ground mesh of the slice, the RCELL Mega cell is guaranteed to be over a legal base array.

Referring now to FIG. 13, diffused Mega cells can only be placed in specific sites or areas on the target slice. The specific "legal" sites are pre-diffused areas. Typically, these sites allow the placement of Mega cells with multiple orientations. Additionally, some Mega cells may overlap multiple diffused areas. Such Mega cells contain multiple sites that may include several groupings of sites at the chip level. There may be a complex relationship between the orientation of the sites within the Mega cell and those on the slice.

To place diffused Mega cells, the system must identify a matching group of sites on the slice that exactly match the grouping and orientation of the Mega cell. First, the system scans the slice definition to identify pre-diffused locations on the slice (step 1300). Next, the system loads the diffused Mega cell to be placed (step 1302). The system determines the parameters of the Mega cell to be placed (step 1304). The system searches all of the pre-diffused locations to find a matching site grouping that exactly matches the grouping and orientation of the Mega cell (step 1306). Once the system identifies an exact match, the diffused Mega cell is mapped to the location (step 1308), and the target point is snapped to the power/ground mesh of the slice (step 1310).

In general, the search for an exact match is exhaustive, meaning that all possible diffused locations are considered, and all legal orientations and placements of the Mega cell are determined to find the best possible match. However, due to the limited number of diffused sites provided on any given slice, the processing time required to identify the matching location is less than 10 milliseconds per Mega cell on a processor with a clock speed of approximately 1 GigaHertz for a typical slice. Thus, processing time is not significant.

The auto-interactive placement algorithm provided within the placement software application enables designers to automatically place complex logic functions on a pre-fabricated slice with little or no knowledge of the configuration of the slice. Specifically, the designer need not be concerned with the complex electrical and manufacturing design rules involved in the placement. Since the placement of cells is correct at the time of the logical to physical mapping by means of the exhaustive placement algorithms, costly design iterations are eliminated, which ordinarily are occasioned by discovery of design rule violations by other design tools in later phases of the design process.

In general, the pre-fabricated slice can utilize a default base array power/ground grid or a custom grid, depending on the implementation. Each grid line is a valid placement location for an element. This allows other design tools to be used with the present invention. A legalizer algorithm within the system simply snaps the cells onto a valid gate array placement site.

Since the system is intended to be usable with other design tools, the system can be implemented either as a standalone tool (or executable) or as an option to another design tool, which could run the legalizing function after placement if the technology is gate array. In this embodiment, the designer would call the legalizer function of the system as an option after placing the cells. The legalizer would then analyze the placement, and snap the various placed cells to the closest, legal target locations on the slice.

While the system of the present invention was discussed with respect to loading various elements and definitions into memory, workers skilled in the art will recognize that it is possible to operate the present invention by searching databases or other memory locations. Parameters and other abstracted elements of a slice definition can be searched within the database, without loading the definition into memory.

Although the present invention has been described with reference to preferred embodiments, workers skilled in the art will recognize that changes may be made in form and detail without departing from the spirit and scope of the invention.

What is claimed is:

1. A method of mapping logical components onto a pre-fabricated chip slice, the method being implemented by one or more software applications and comprising:
   receiving a definition of the pre-fabricated chip slice, which comprises rows of basic cell unit locations and at least one diffused location that spans multiple rows of the basic cell unit locations and accepts only particular types of cells;
   selecting a logical function block for placement as a single unit onto the chip slice, wherein the logical function block comprises a Mega cell that spans at least one of the diffused locations and a plurality of the basic cell unit locations adjacent to the diffused location;
   searching the definition of the chip slice for a location that is available for placement of the selected function block; and
   mapping the selected function block to the available location.

2. The method of claim 1 wherein before the step of receiving, the method further comprising:
   generating instance information about the chip slice based on the definition.

3. The method of claim 2 wherein the step of generating instance information comprises:
   identifying pertinent information about the slice;
   creating site definitions for base array rows and diffused locations on the slice;
   assigning properties to the rows and locations;
   identifying the power and ground rail structures; and
   storing the properties, site definitions and power and ground rail structure information in a slice database.

4. The method of claim 3 wherein the pertinent information includes one or more elements selected from a group consisting of row orientations, valid cell orientations within rows, the diffused locations on the slice, and all possible orientations of a diffused cell site.

5. The method of claim 1 wherein the step of receiving comprises:
   selecting a prefabricated chip slice from a group of two or more prefabricated chip slices; and
   importing the slice definition corresponding to the selected chip slice into an integrated circuit design tool.

6. The method of claim 1 wherein after the step of receiving, the method further comprises:
   providing a graphical representation of the chip slice based on the received definition; and
   selecting a target location on the graphical representation for placement of the logical function block onto the chip slice.

7. The method of claim 6 wherein the step of searching comprises:
   identifying available locations for the logical function block on the chip slice; and
   searching the available locations for a placement location that is closest to the target location.

8. The method of claim 7 wherein identifying available locations comprises:
   selecting a row;
   calculating a distance between the row and the target location; and
   if the selected row is closer than a previously selected row, setting a closest row parameter equal to the selected row.

9. The method of claim 1 wherein the selected logical function block Mega cell comprises a diffused Mega cell and wherein the step of searching comprises:
   identifying all open diffused locations on the slice; and
   comparing each open diffused location and all possible groupings of open diffused locations with a cell definition of the selected function block to exactly match the selected function block to an open diffused location or group of locations on the chip slice.

10. The method of claim 1 wherein:
    the selected function block comprises a diffused Mega cell;
    the step of searching comprises searching the definition of the chip slice for an unused pre-diffused Mega cell location on the chip slice that spans multiple rows on the chip slice; and
    the step of mapping comprises mapping the diffused Mega cell to the unused pre-diffused Mega cell location.

11. The method of claim 1 wherein:
    the selected function block comprises an RCELL Mega cell;
    the step of searching comprises searching the definition of the chip slice for a plurality of unused pre-diffused RCELL locations on the chip slice that span multiple rows on the chip slice; and
    the step of mapping comprises mapping the RCELL Mega cell to the plurality of unused pre-diffused RCELL locations.

12. The method of claim 1 wherein the step of mapping comprises:
    orienting the selected function block to match an orientation of a power and ground mesh of the chip slice; and
    mapping power and ground elements of the selected function block to the power and ground mesh of the chip slice based on the definition.

13. The method of claim 1 wherein the step of mapping comprises:
    logically mapping the selected function block to the identified location; and physically mapping power and ground elements of the selected function block to a power and ground mesh of the slice.

14. The method of claim 1 and further comprising:
orienting the selected function block to match an orientation of a power and ground mesh adjacent to a legal location on the slice.

15. A method of mapping a function block to a chip slice layout, the method being implemented by one or more software applications and comprising:
receiving a slice definition of a chip slice;
selecting a logical block for placement onto the chip slice corresponding to the chip slice layout, wherein the logical function block comprises a Mega cell that spans multiple rows of basic cell unit locations on the chip slice;
scanning the slice definition for an open site on the chip slice with resources to match corresponding requirements of the logical block;
orienting the logical function block to match a power and ground mesh of the logical function block to a power and ground mesh of the chip slice;
snapping the logical function block to the power and ground mesh of the chip slice; and
mapping the logical block to the open site.

16. The method of claim 15 and further comprising:
receiving a target location corresponding to a point on the chip slice for placement of the logical block.

17. The method of claim 16 wherein the step of scanning comprises:
identifying a row that is closest to the target location; and
identifying an open site within the identified row.

18. The method of claim 15 wherein the step of scanning comprises:
identifying all open locations on the slice that match dimensional parameters of the Mega cell.

19. A system for mapping logical components to a prefabricated chip slice, the system comprising:
a slice database containing information relating to the slice, which comprises rows of basic cell unit locations and at least one diffused location that spans multiple rows of the basic cell unit locations and accepts only particular types of cells;
a logical definition of a Mega cell for mapping onto the slice, wherein the Mega cell spans at least one of the diffused locations and a plurality of the basic cell unit locations adjacent to the diffused location; and
a software application, which searches the slice database for legal locations on the slice corresponding to the logical definition, and which maps the Mega cells onto the slice based on the identified legal cell locations.

20. The system of claim 19 wherein the software application further comprises:
an instance generator adapted to examine and supplement the information contained in the slice database to produce abstracted information relating to the slice; and
a legalizer element adapted to search the abstracted information for the legal placement locations on the slice.

* * * * *